US010961072B2

(12) United States Patent
Chi

(10) Patent No.: US 10,961,072 B2
(45) Date of Patent: Mar. 30, 2021

(54) SPLICING DEVICE AND SPLICING METHOD

(71) Applicant: FUJI CORPORATION, Chiryu (JP)

(72) Inventor: Xiao Dong Chi, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 154 days.

(21) Appl. No.: 16/315,290

(22) PCT Filed: Jul. 19, 2016

(86) PCT No.: PCT/JP2016/071191
§ 371 (c)(1),
(2) Date: Jan. 4, 2019

(87) PCT Pub. No.: WO2018/016013
PCT Pub. Date: Jan. 25, 2018

(65) Prior Publication Data
US 2020/0180889 A1   Jun. 11, 2020

(51) Int. Cl.
*B65H 21/00*   (2006.01)
*B65H 19/18*   (2006.01)
(Continued)

(52) U.S. Cl.
CPC ......... *B65H 19/1852* (2013.01); *B65H 21/00* (2013.01); *H05K 13/0215* (2018.08);
(Continued)

(58) Field of Classification Search
CPC ............... B65H 19/1852; B65H 21/00; B65H 2301/46222; B65H 2403/51; B65H 2701/1942; H05K 13/0419; H05K 13/0215
See application file for complete search history.

(56) References Cited

U.S. PATENT DOCUMENTS 3,995,791 A  *  12/1976  Schoppee .......... B65H 19/1852
                                                      242/421.7
4,815,405 A  *   3/1989  Young, Jr. ............ D05B 35/04
                                                          112/307
(Continued)

FOREIGN PATENT DOCUMENTS

JP        53-19811         2/1978
JP        5-338877 A      12/1993
(Continued)

OTHER PUBLICATIONS

International Search Report dated Sep. 27, 2016 in PCT/JP2016/071191 filed on Jul. 19, 2016.

*Primary Examiner* — Sang K Kim
(74) *Attorney, Agent, or Firm* — Oblon, McClelland, Maier & Neustadt, L.L.P.

(57) ABSTRACT

A splicing device includes a drive device configured to cause a pressing surface of a first pressing member and a pressing surface of a second pressing member to reciprocate relatively towards and away from each other through a series of actions and a control device configured to stop temporarily the series of actions of the drive device in a pressing state where the first pressing member and the second pressing member press a first splicing tape and a second splicing tape against a first carrier tape and a second carrier tape through the series of actions of the drive device.

5 Claims, 28 Drawing Sheets

(51) Int. Cl.
*H05K 13/04* (2006.01)
*H05K 13/02* (2006.01)

(52) U.S. Cl.
CPC ............... *H05K 13/0419* (2018.08); *B65H 2301/46222* (2013.01); *B65H 2403/51* (2013.01); *B65H 2701/1942* (2013.01)

(56) References Cited

U.S. PATENT DOCUMENTS

| | | | | |
|---|---|---|---|---|
| 5,053,096 A | * | 10/1991 | Long | B65H 19/1852 156/157 |
| 5,066,345 A | * | 11/1991 | Long | B65H 19/1852 156/157 |
| 5,066,346 A | * | 11/1991 | Long | B65H 19/1852 156/157 |
| 2007/0075179 A1 | * | 4/2007 | Mizutani | B65H 19/14 242/555.4 |
| 2015/0053809 A1 | * | 2/2015 | Chi | H05K 13/021 242/553 |
| 2015/0060590 A1 | * | 3/2015 | Chi | B65H 21/00 242/556.1 |

FOREIGN PATENT DOCUMENTS

| | | |
|---|---|---|
| JP | 2002-207286 A | 7/2002 |
| JP | 2014-225591 A | 12/2014 |
| WO | WO 2013/157107 A1 | 10/2013 |
| WO | WO 2014/167692 A1 | 10/2014 |

\* cited by examiner

[FIG. 1]
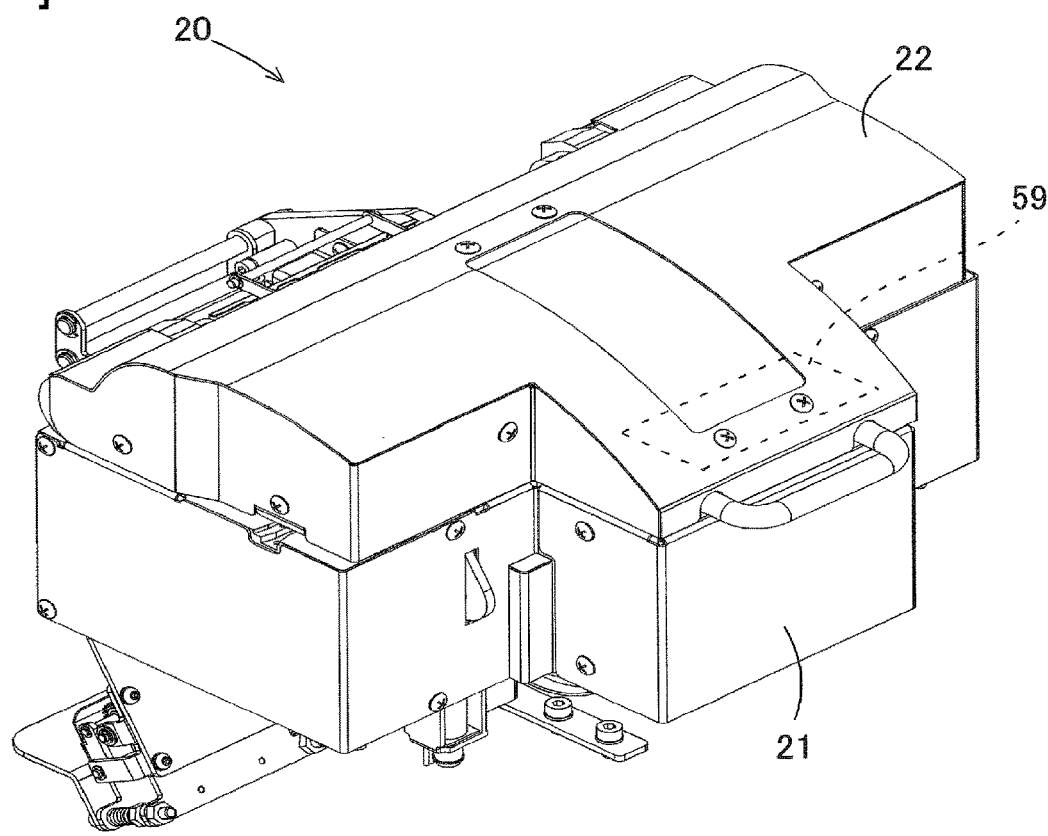

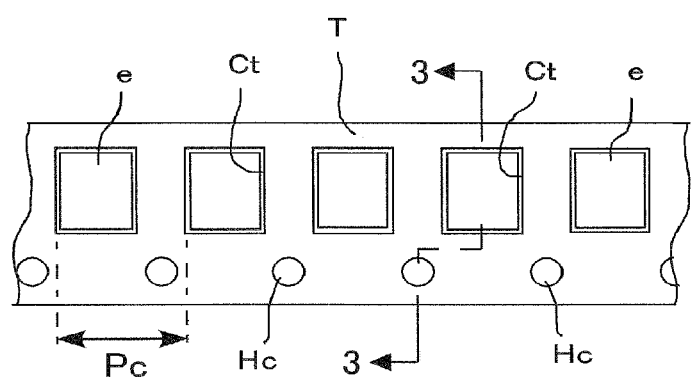
[FIG. 2]

[FIG. 3]
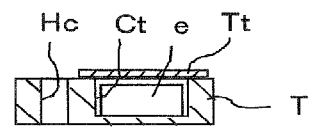

[FIG. 4]
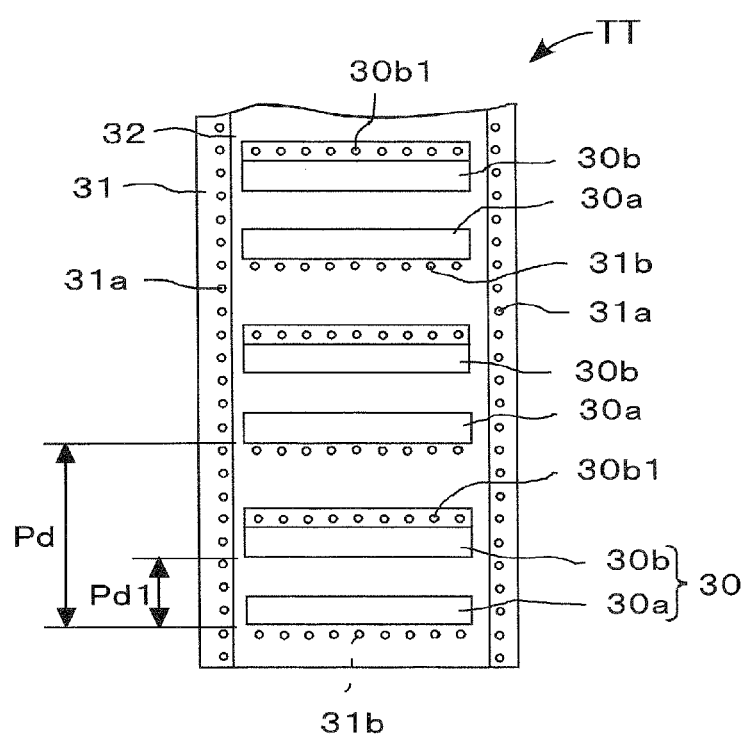

[FIG. 5]
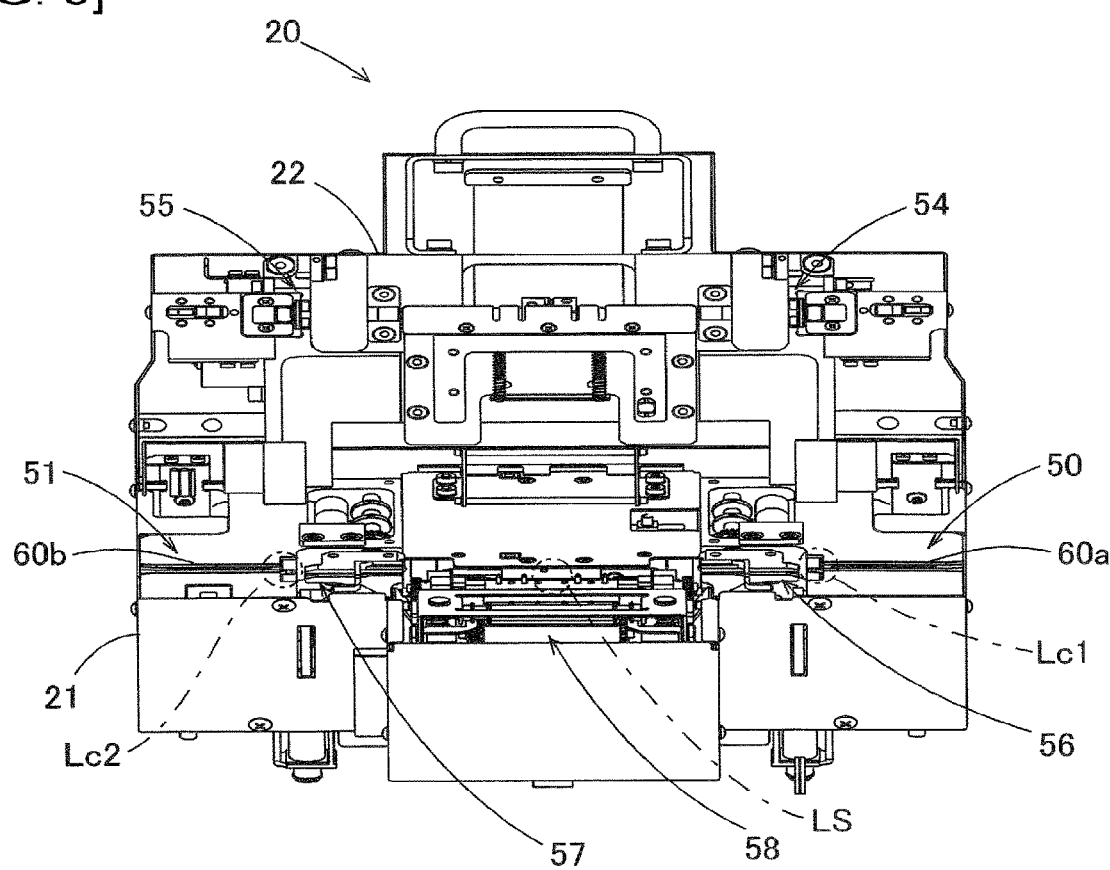

[FIG. 6]
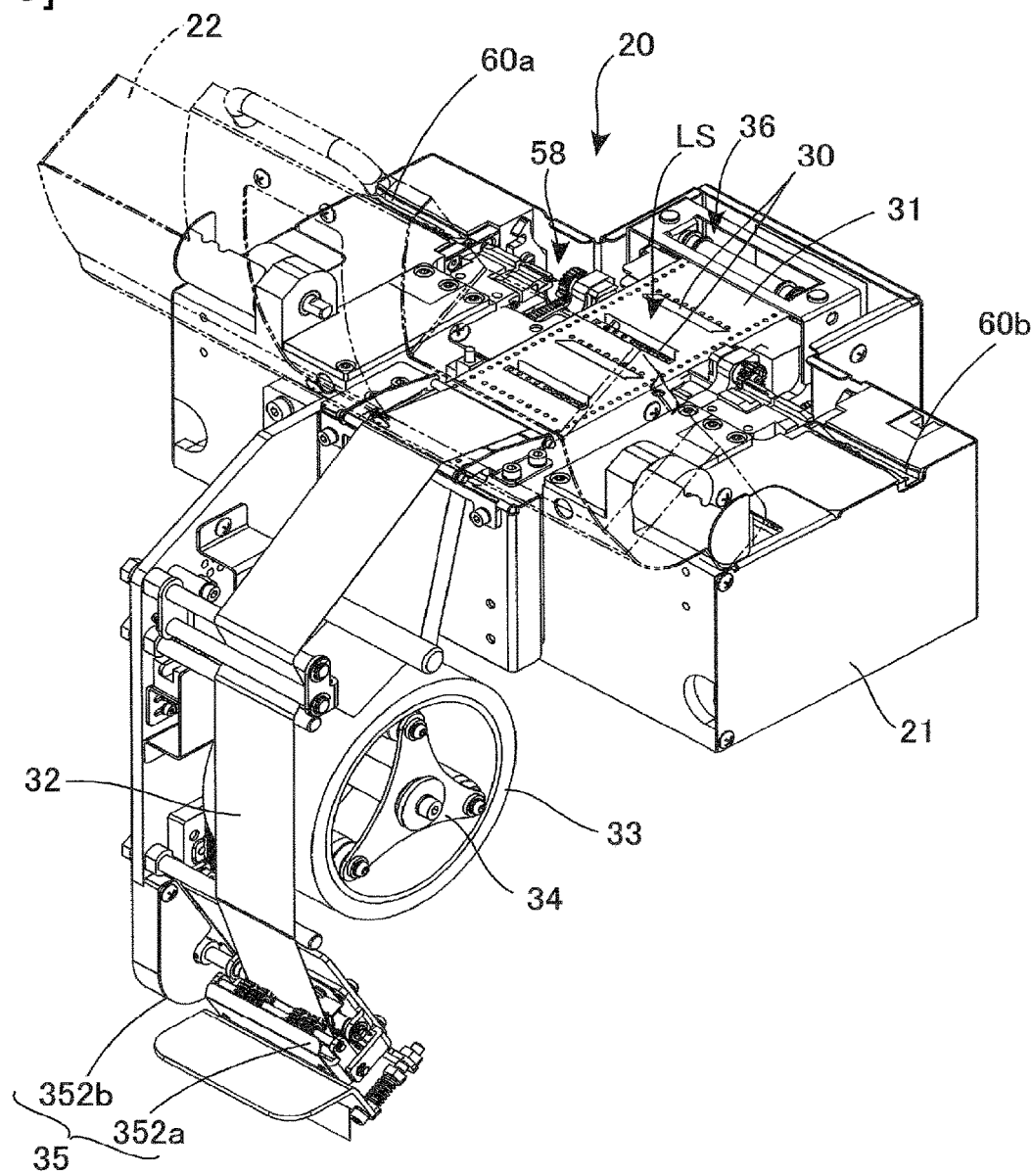

[FIG. 7]
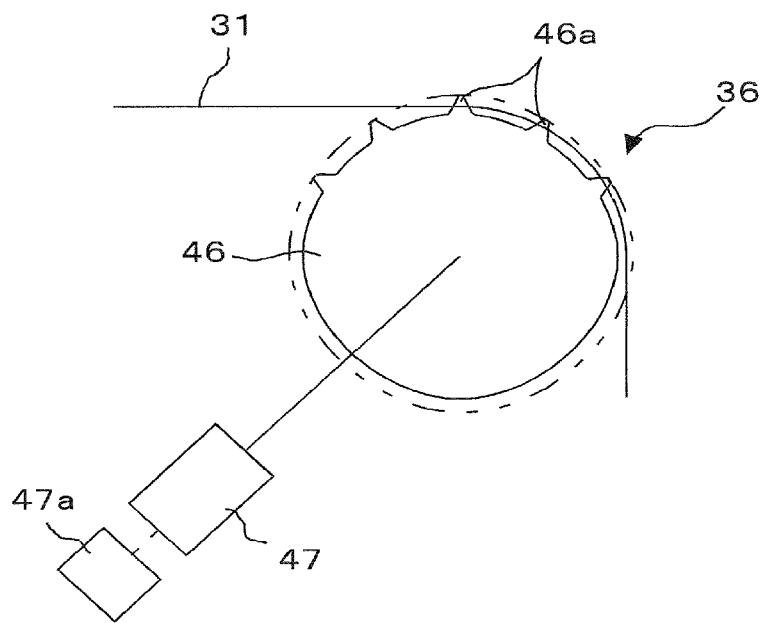

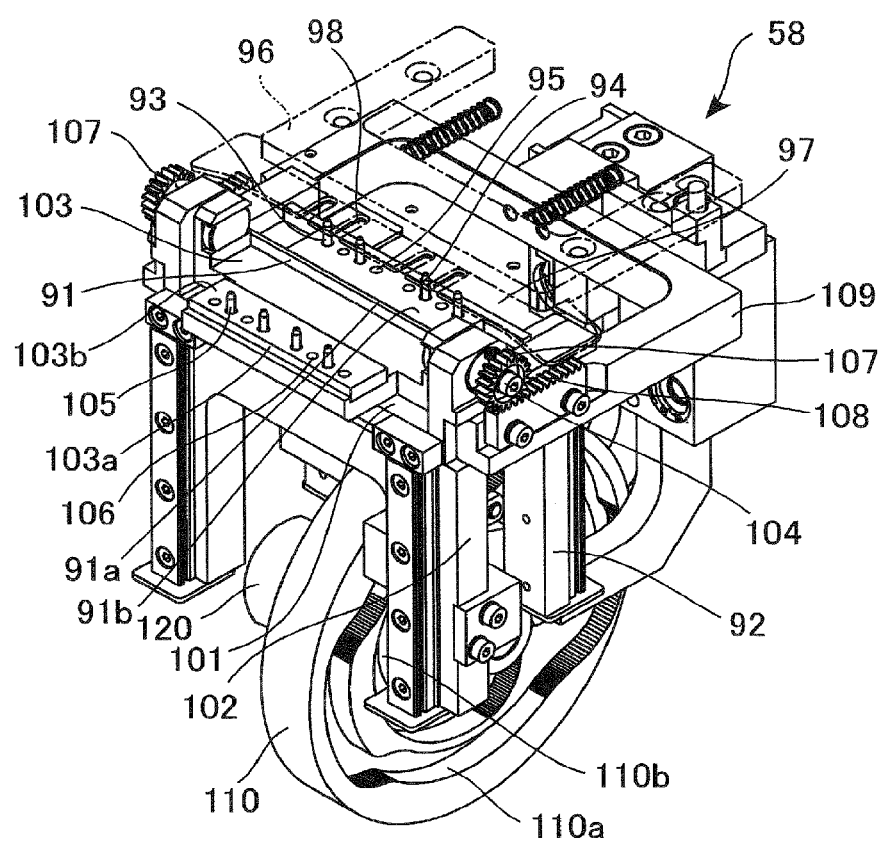
[FIG. 8]

[FIG. 9]
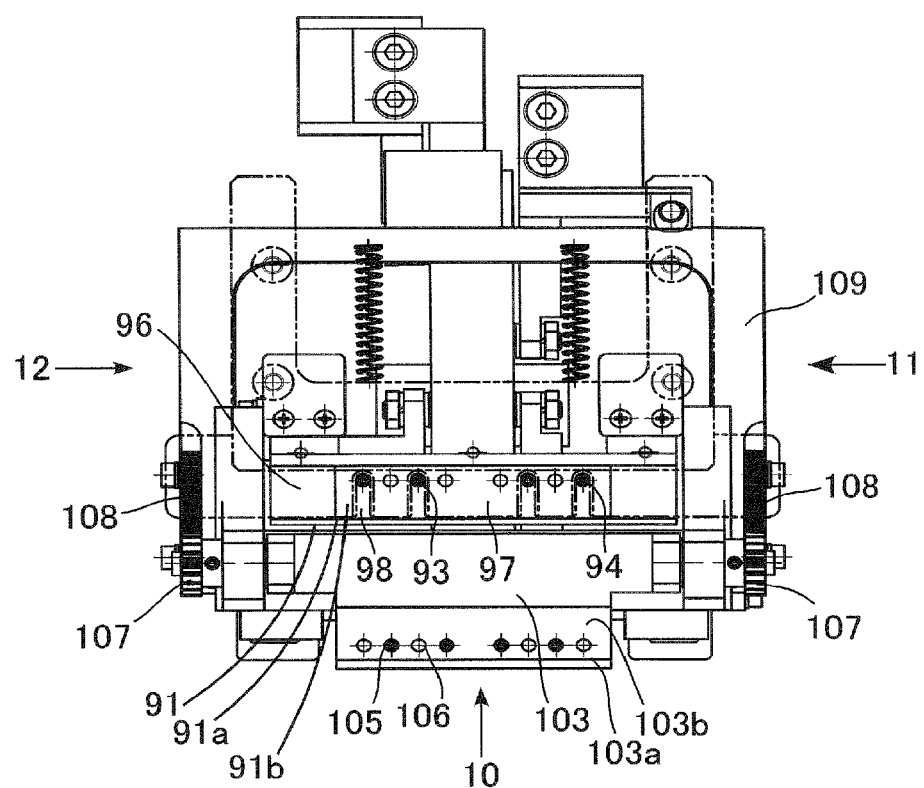

[FIG. 10]
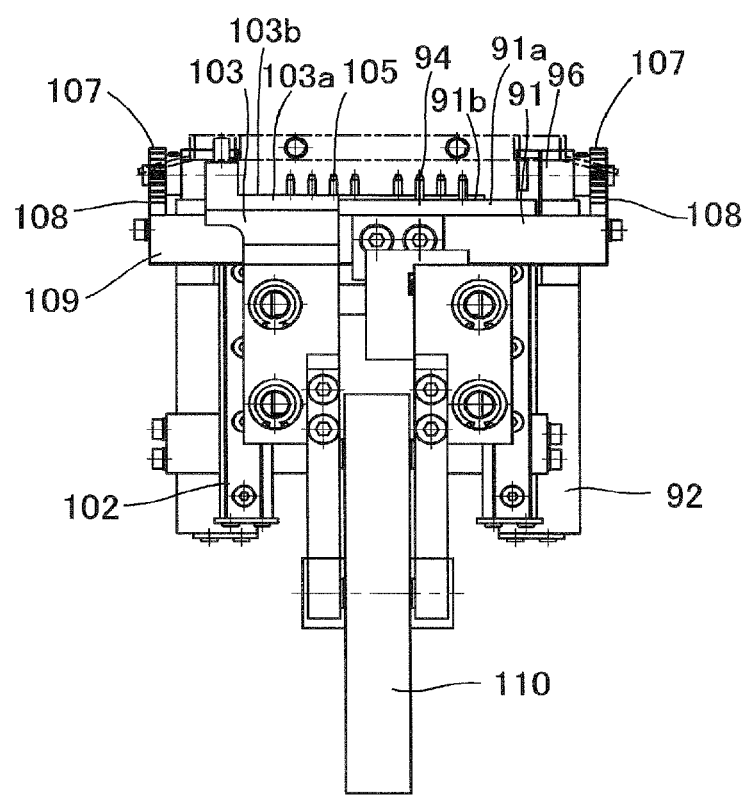

[FIG. 11]
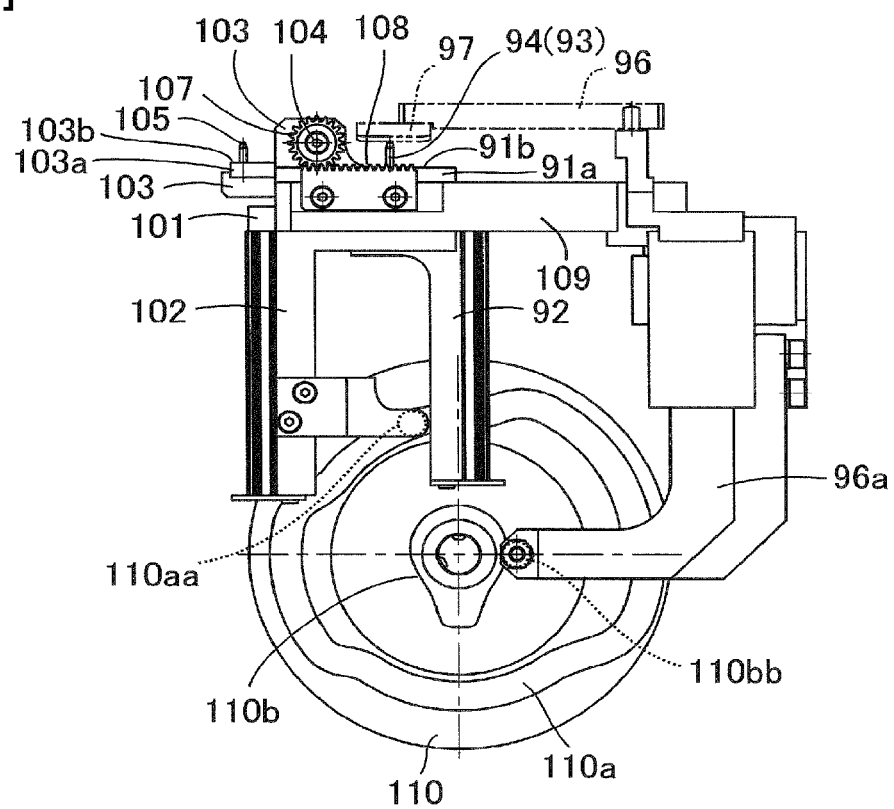

[FIG. 12]
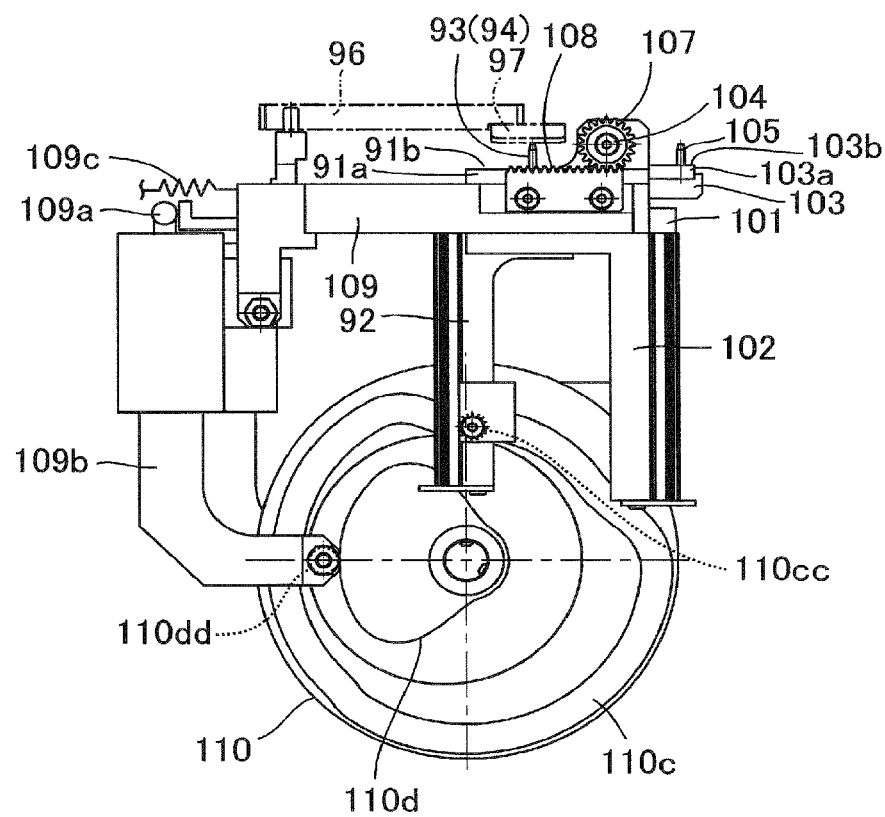

[FIG. 13]
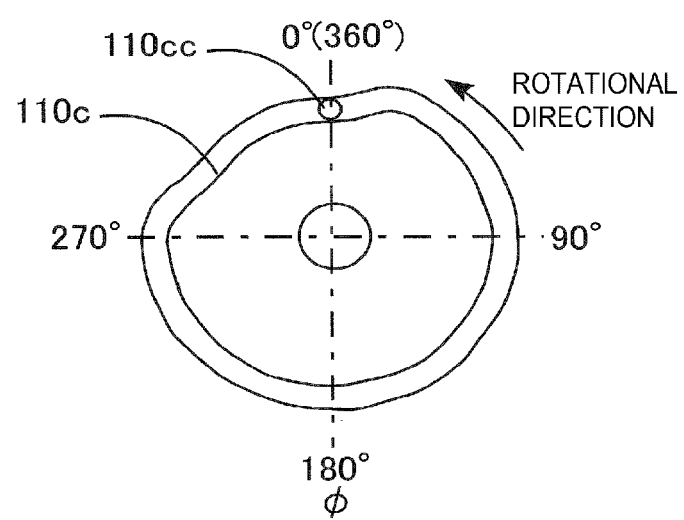

[FIG. 14]
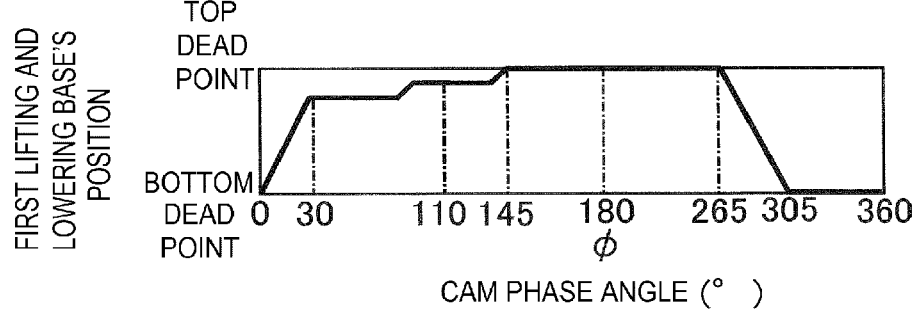

[FIG. 15]
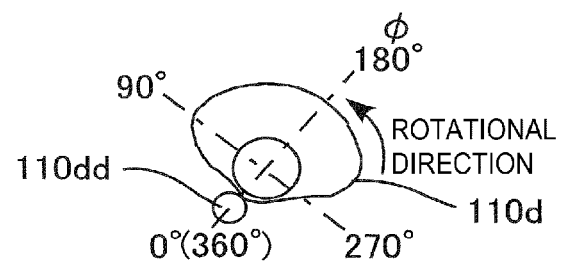

[FIG. 16]
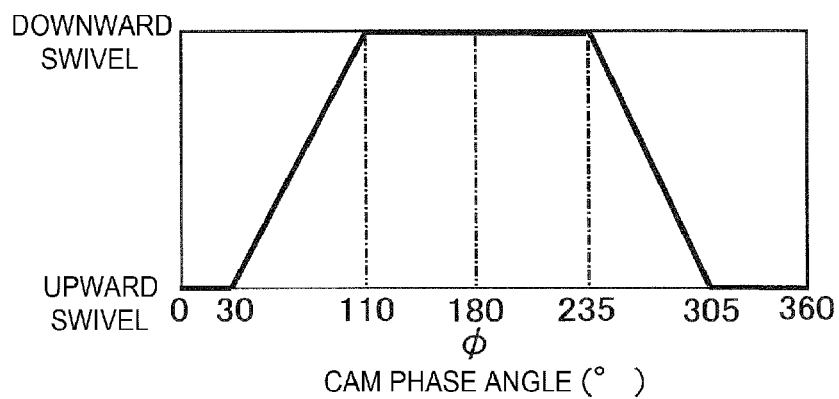

[FIG. 17]
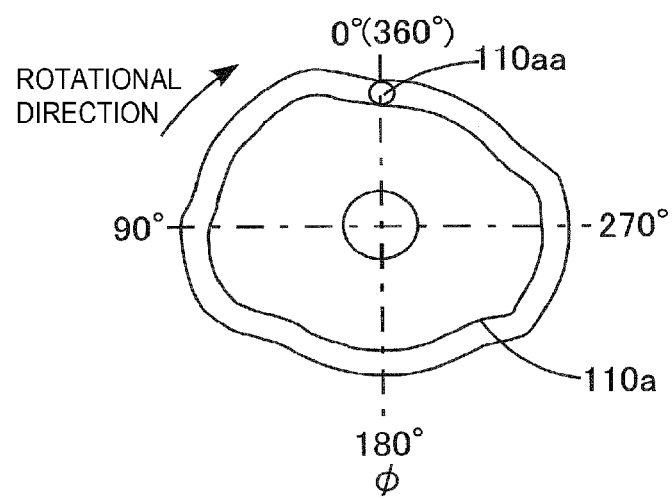

[FIG. 18]
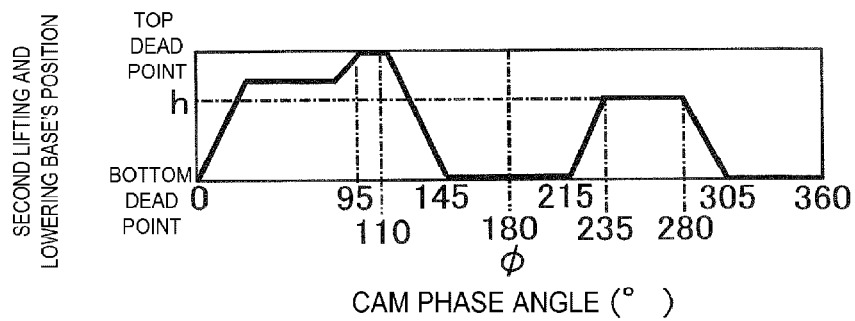

[FIG. 19]
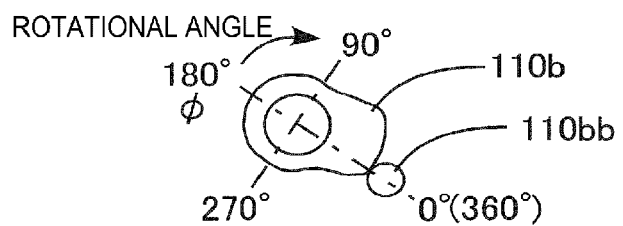

[FIG. 20]
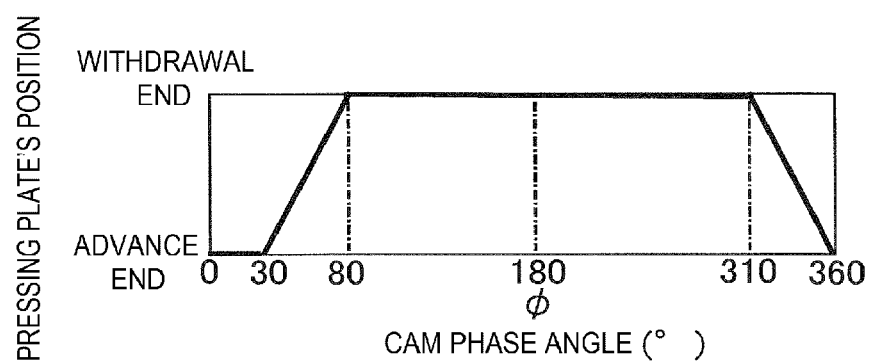

[FIG. 21A]
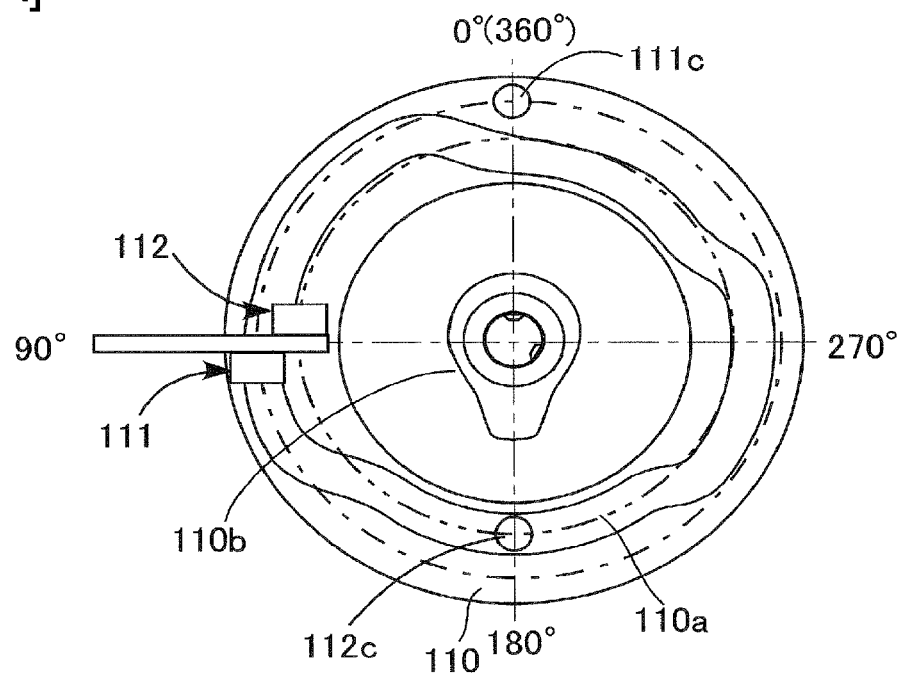
[FIG. 21B]
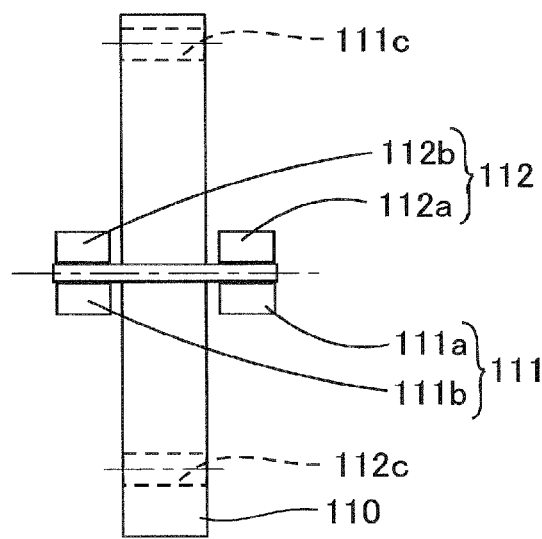

[FIG. 22]
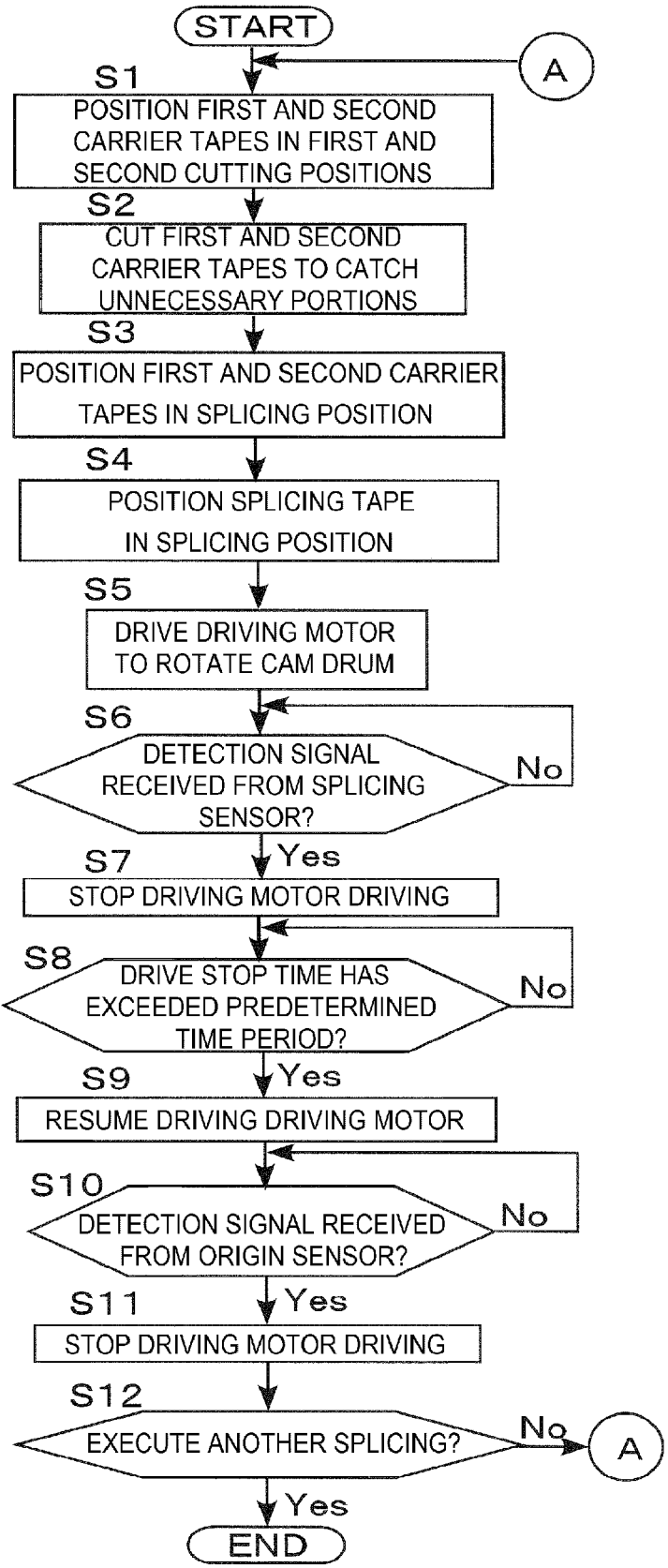

[FIG. 23]
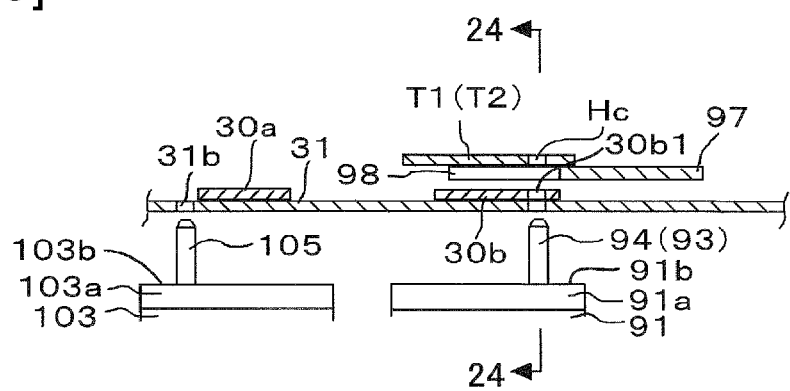

[FIG. 24]
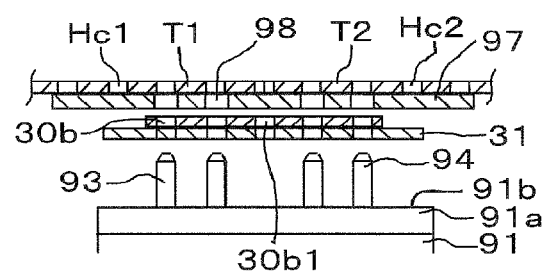

[FIG. 25]
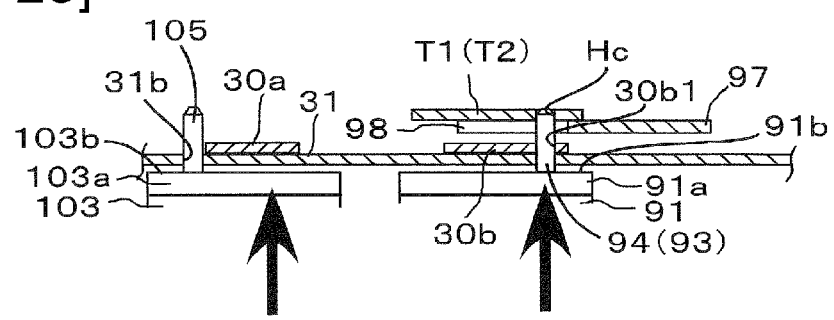

[FIG. 26]
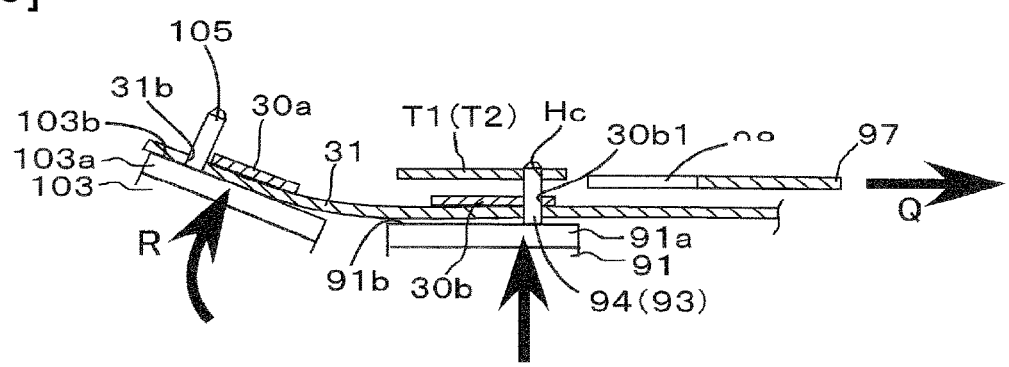

[FIG. 27]
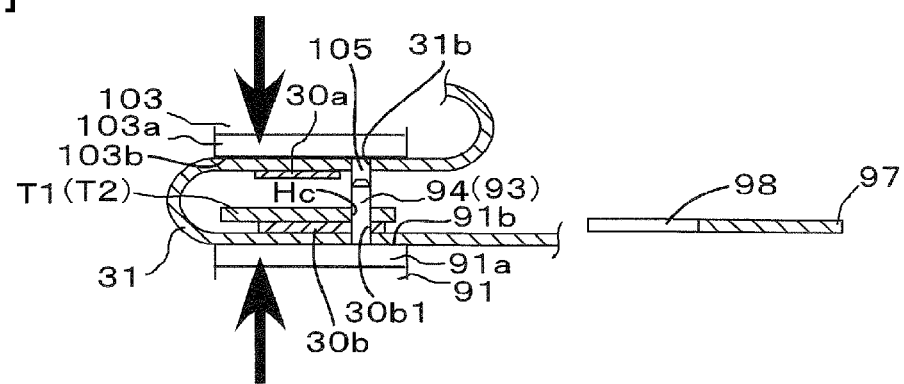

[FIG. 28]
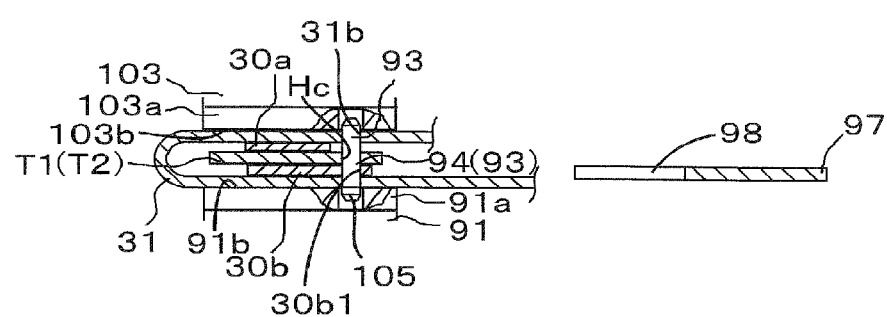

SPLICING DEVICE AND SPLICING METHOD

TECHNICAL FIELD

The present application relates to a splicing device and a splicing method for connecting carrier tapes with a splicing tape.

BACKGROUND ART

Generally, in an electronic component mounter, a reel on which a carrier tape storing multiple electronic components (hereinafter, referred to simply as "components") at regular intervals is wound is loaded into a tape feeder. Then, by driving a sprocket engaging with feeding holes in the carrier tape, the carrier tape is fed out by a constant amount to sequentially supply components to a component supply position where the components are picked up by a suction nozzle to be mounted on a board.

In this type of electronic component mounter, when the remaining number of components stored on one reel is small, so-called splicing is performed in a splicing device in which a leading end of a carrier tape (hereinafter, referred to as a "second carrier tape") wound around a separate reel storing the same type of component is connected to a tail end of a carrier tape (hereinafter, referred to as a "first carrier tape") where the remaining number of stored components is small by using a splicing tape.

For example, in a splicing device described in Patent Literature 1, a first carrier tape and a second carrier tape are fed in directions in which the first and second carrier tape move toward each other from both sides of the splicing device, and a tail end of the first carrier tape and a leading end of the second carrier tapes are positioned in a splicing position. Then, a front surface splicing tape and a rear surface splicing tape are pressed against a front surface and a rear surface, respectively, of the terminating end of the first carrier tape and the initiating end of the second carrier tape which are positioned in the splicing position to be affixed to each other while extending over the relevant ends of the first and second carrier tapes by a cam drive mechanism.

CITATION LIST

Patent Literature

Patent Literature 1: WO 2013/157107

BRIEF SUMMARY

Technical Problem

In the conventional splicing device, the affixation of the splicing tape to the carrier tapes is insufficient due to the affixation force of the splicing tape, whereby the splicing tape may peel off from the carrier tapes. Although this problem can be dealt with by driving a cam at low speeds so as to extend the pressing time of the splicing tape against the carrier tapes, this extends the cycle time of the splicing. Although the pressing time of the splicing tape against the carrier tapes can also be extended by modifying the shape of a cam groove, this increases the size of the cam, whereby the size of the splicing device is increased.

An object of the present disclosure is to provide a splicing device and a splicing method by which splicing tape can be reliably affixed to carrier tapes.

Solution to Problem

With a view to achieving the object, according to the present disclosure, there is provided a splicing device for connecting a first carrier tape and a second carrier tape together with a first splicing tape and a second splicing tape, the first carrier tape and the second carrier tape having component storing cavities, the splicing device comprising: a positioning device configured to feed the first carrier tape and the second carrier tape in directions, in which the first carrier tape and the second carrier tape approach each other, and position an end of the first carrier tape and an end of the second carrier tape in a splicing position; a first pressing member configured to press the first splicing tape extendingly against a first surface of the first carrier tape and the second carrier tape, which are both positioned in the splicing position; a second pressing member configured to press the second splicing tape extendingly against a second surface of the first carrier tape and the second carrier tape, which are both positioned in the splicing position; a driving device configured to move relatively and reciprocally a pressing surface of the first pressing member and a pressing surface of the second pressing member in directions in which the pressing surface of the first pressing member and the pressing surface of the second pressing member move towards and away from each other by performing a series of actions; and a control device configured to stop temporarily the series of actions of the driving device in a pressing state where the first pressing member and the second pressing member are pressing the first splicing tape and the second splicing tape respectively against the first carrier tape and the second carrier tape through the series of actions of the driving device.

According to this configuration, with the splicing device, since the series of actions of the driving device configured to drive the first and second pressing members is stopped temporarily in the pressing state where the first and second pressing members are pressing the splicing tapes against the first and second carrier tapes, the pressing time of the splicing tapes against the first and second carrier tapes can be extended. Thus, the splicing tapes can be reliably affixed to the first and second carrier tapes.

With a view to achieving the object, according to the present disclosure, there is provided a splicing method for connecting a first carrier tape and a second carrier tape together with a first splicing tape and a second splicing tape, the first carrier tape and the second carrier tape having component storing cavities, the splicing method comprising: a positioning step of feeding the first carrier tape and the second carrier tape in directions in which the first carrier tape and the second carrier tape move towards each other to position an end of the first carrier tape and an end of the second carrier tape in a splicing position; a pressing step of pressing the first splicing tape against a first surface of the first carrier tape and the second carrier tape, which are both positioned in the splicing position, so as to extend over the first carrier tape and the second carrier tape through a series of actions of a driving device and pressing the second splicing tape against a second surface of the first carrier tape and the second carrier tape, which are both positioned in the splicing position, so as to extend over the first carrier tape and the second carrier tape through the series of actions of the driving device; and a stopping step of stopping temporarily the series of actions of the driving device in a pressing state where the first splicing tape and the second splicing tape are being pressed against the first carrier tape and the second carrier tape through the series of actions of the driving device. According to this configuration, the same advantageous effect as that obtained by the splicing device of the present disclosure can be obtained.

BRIEF DESCRIPTION OF DRAWINGS

FIG. 1 is a perspective view showing a splicing device in its entirety illustrating an embodiment of the present disclosure.

FIG. 2 is a drawing showing a carrier tape held in a tape feeder.

FIG. 3 is a sectional view taken along a line 3-3 in FIG. 2.

FIG. 4 is a drawing showing an affixation of splicing tapes to a base tape of a splicing tape supply member.

FIG. 5 is a drawing showing the splicing device with a lid opened.

FIG. 6 is a drawing showing the splicing device with a splicing tape supply member mounted thereon.

FIG. 7 is a drawing showing a splicing tape supply member conveyance device configured to feed the splicing tape supply member.

FIG. 8 is a perspective view showing a joining device configured to join a splicing tape to a carrier tape.

FIG. 9 is a plan view of the joining device.

FIG. 10 is a front view as seen from a direction indicated by an arrow 10 in FIG. 9.

FIG. 11 is a right side view as seen from a direction indicated by an arrow 11 in FIG. 9.

FIG. 12 is a left side view as seen from a direction indicated by an arrow 12 in FIG. 9.

FIG. 13 is a drawing showing a first cam groove formed in a cam drum of the joining device.

FIG. 14 is a cam diagram of the first cam groove.

FIG. 15 is a drawing showing a second cam groove formed in the cam drum of the joining device.

FIG. 16 is a cam diagram of the second cam groove.

FIG. 17 is a drawing showing a third cam groove formed in the cam drum of the joining device.

FIG. 18 is a cam diagram of the third cam groove.

FIG. 19 is a drawing showing a fourth cam groove formed in the cam drum of the joining device.

FIG. 20 is a cam diagram of the fourth cam groove.

FIG. 21A is a drawing of a sensor disposed on the cam drum as seen from an axial direction.

FIG. 21B is a drawing of the sensor disposed on the cam drum as seen from a radial direction.

FIG. 22 is a flow chart describing operations before a splicing tape is joined to a carrier tape in the splicing device.

FIG. 23 is a sectional view showing a relationship between a carrier tape and a splicing tape in a splicing position as seen from a feeding direction of the carrier tape.

FIG. 24 is a sectional view taken along a line 24-24 in FIG. 23.

FIG. 25 is a drawing showing a state where a first lifting and lowering base and a second lifting and lowering base are raised.

FIG. 26 is a drawing showing a state where a swivel base provided on the second lifting and lowering base is turned.

FIG. 27 is a drawing showing a state where the swivel base provided on the second lifting and lowering base has completed a turn.

FIG. 28 is a drawing showing a state where the carrier tape and the splicing tape are pressed together by the first lifting and lowering base and the second lifting and lowering base.

DESCRIPTION OF EMBODIMENTS

1. Schematic Configuration of Splicing Device

Hereinafter, a schematic configuration of a splicing device according to an embodiment of the present disclosure will be described based on drawings. As shown in FIG. 1, splicing device 20 is configured to splice together carrier tape T (refer to FIGS. 2 and 3) of the current reel and carrier tape T of the next reel that are inserted from both sides of device main body 21 with splicing tape 30 (refer to FIG. 4) that is supplied by splicing tape supply member TT (refer to FIG. 4) by bringing the carrier tapes into abutment with each other at a center of device main body 21 with openable and closable lid 22 closed.

Here, as shown in FIGS. 2 and 3, carrier tape T is formed long and narrow with a predetermined width and has a number of cavities Ct that are provided at constant pitch intervals Pc in a longitudinal direction, and components e to be mounted on a board are stored in cavities Ct. Upper portions of cavities Ct are opened and are covered with cover tape Tt that is affixed to a surface of carrier tape T. Feed holes He are formed along one edge in a width direction of carrier tape T, at the same pitch intervals Pc as those of cavities Ct or pitch intervals 2Pc twice those of cavities Ct, and these feed holes He are arranged in a certain fixed positional relationship with cavities Ct.

As shown in FIG. 4, splicing tape supply member TT has a three-layer structure of splicing tape 30, base tape 31, and top film 32. Splicing tape 30 is made up of a pair of front surface and rear surface splicing tapes 30a, 30b that are bonded to both surfaces of two carrier tapes T so as to extend over them on an upper surface of base tape 31. That is, splicing tape 30 is front surface splicing tape 30a (a first splicing tape) that is joined to the front surface of two carrier tapes T and rear surface splicing tape 30b (a second splicing tape) that is joined to the rear surface of two carrier tapes T.

Splicing tape 30, which is the pair of front surface and rear surface splicing tapes, is affixed to base tape 31 at constant pitch intervals Pd in a longitudinal direction thereof while maintaining a constant positional relationship with feed holes 31a opened at constant pitch intervals in both sides of base tape 31. A pair of splicing tapes 30 are disposed with a predetermined interval Pd1 with the surface splicing tape 30a on the leading side. Then, continuous top film 32 is bonded to the upper surface of splicing tape 30. Metal powder is embedded in splicing tape 30, and splicing device 20 detects splicing tape 30 by a tape detection sensor, not shown, configured to detect metal.

As to bonding forces with which top film 32 and base film 31 are bonded to both surfaces of splicing tape 30, a bonding force with which base tape 31 is bonded is stronger so that even though top film 32 is separated off from splicing tape 30, splicing tape 30 is prevented from being separated from base tape 31. However, when carrier tape T is bonded to a bonding surface of splicing tape 30 from which top film 32 is separated, the adhesive force of carrier tape T to splicing tape 30 is stronger than the adhesive force of splicing tape 30 to base tape 31, so that base tape 31 can be separated from splicing tape 30 easily.

A transverse dimension of base tape 31 is greater than a transverse dimension of top film 32, and transverse ends of base tape 31 project from transverse ends of top film 32. On the other hand, a transverse dimension of splicing tape 30 is equal to the transverse dimension of top film 32, and splicing tape 30 is affixed to base tape 31 inside feed holes 31a. In base tape 31, multiple positioning holes 31b are formed along the width direction of base tape 31 at the same pitch intervals as those of feed holes He formed in carrier tape T in a position close to front surface splicing tape 30a.

In addition, in rear surface splicing tape 30b, multiple positioning holes 30b1 are formed along the width direction of base tape 31 at the same pitch intervals as those of feed holes He formed in carrier tape T so as to penetrate base tape 31. Feed holes 31a and positioning holes 31b that are formed in base tape 31 are formed with a punching press at the same time as positioning holes 30b1 are formed in rear surface splicing tape 30b after splicing tape 30 is affixed in the predetermined position on base tape 31.

As shown in FIGS. 5, 6, and 7, splicing device 20 includes first and second tape feed devices 50, 51, first and second cutting devices 54, 55, first and second take-in devices 56, 57, supply reel holding section 34, top film conveyance device 35, splicing tape supply member conveyance device 36 (corresponding to a "conveyance device" of the present disclosure), joining device 58, and control device 59 (refer to FIG. 1). In the following description, splicing target two carrier tapes T will be referred to as first and second carrier tapes T1, T2.

As shown in FIG. 5, first and second tape feed devices 50, 51 convey first and second carrier tapes T1, T2 along first and second conveyance paths 60a, 60b that extend to the center of device main body 21 from both side surfaces thereof and position predetermined first and second cutting portions of first and second carrier tapes T1, T2 in first and second cutting positions Lc1, Lc2 sequentially. That is, first and second tape feed devices 50, 51 function as first and second positioning devices.

First and second cutting devices 54, 55 cut out first and second unnecessary portions at the first and second cutting points of first and second carrier tapes T1, T2. As the first cutting portion of first carrier tape T1, for example, an intermediate position between cavity Ct storing a component e of first carrier tape T1 and cavity Ct not storing component e of first carrier tape T1 is selected. The same applies to the second cutting portion of second carrier tape T2.

First and second take-in devices 56 and 57 catch first and second unnecessary portions cut off from first and second carrier tapes T1, T2, respectively. That is, cut-off first carrier tape T1 to which empty cavity Ct continues is caught by first take-in device 56 as a first unnecessary portion for disposal. The same applies to a second unnecessary portion of second carrier tape T.

As shown in FIG. 6, supply reel holding section 34 is attached to device main body 21 and supports rotatably supply reel 33 around which splicing tape supply member TT is wound into a roll. Supply reel holding section 34 is pressed against supply reel 33 with a predetermined friction force generated by a spring force, so that the rotation of supply reel 33 relative to supply reel holding section 34 is limited by supply reel holding section 34. Then, when base tape 31 is pulled by an operation force that overcomes the friction force, supply reel 33 can rotate relative to supply reel holding section 34.

Top film conveyance device 35 includes roller 352a configured to hold and feed out top film 32 and motor 352b configured to rotate roller 352a and is disposed below supply reel 33. Top film conveyance device 35 feeds out top film 32 that is folded back in an opposite direction to a conveyance direction of splicing tape supply member TT by an operator to thereby separate top film 32 from base tape 31.

As shown in FIG. 7, splicing tape supply member conveyance device 36 includes feed sprocket 46 and stepping motor 47 and feeds out base tape 31 from which splicing tape 30 is separated. That is, multiple engaging teeth 46a are formed on feed sprocket 46 circumferentially at equal angular intervals, that is, at the same pitch intervals as the pitch intervals at which feed holes 31a are opened in base tape 31.

Base tape 31, from which top film 32 is separated, that is, base tape 31, to which a number of splicing tapes 30 are affixed with their bonding surfaces directed upwards, passes through joining device 58 so as to pass across a center of splicing position LS, and feed holes 31a of base tape 31 engage with engaging teeth 46a of feed sprocket 46.

Stepping motor 47 is connected to feed sprocket 46, and base tape 31, which engages with engaging teeth 46a, is fed out a unit amount when feed sprocket 46 is driven one pitch by stepping motor 47. Stepping motor 47 is returned to its origin every time a power supply is turned on and is positioned so that one of engaging teeth 46a of feed sprocket 46 is situated in an apex position at all times.

Additionally, stepping motor 47 is configured to restrain its rotation as required, for example, by rotation restraining device 47a such as a servo lock device or the like, or by being excited. A frictional action of supply reel holding section 34 and rotation restraining device 47a constitute a preventive device configured to prevent base tape 31 from rising by restricting movements of base tape 31 on both ends thereof when taking out first and second carrier tapes T1, T2 which have been spliced together from an interior of splicing device 20.

As shown in FIG. 5, joining device 58 is provided between first cutting device 54 and second cutting device 55. Joining device 58 includes a tape detection sensor, not shown, configured to detect splicing tapes 30a, 30b, the tape detection sensor being set in front of splicing position LS, as viewed from FIG. 5, lying below base tape 31 fed in from supply reel 33 in a position situated a certain distance away from splicing position LS.

As shown in FIG. 6, joining device 58 connects together first and second carrier tapes T1, T2 that are fed in from the left and right of device main body 21 and are then brought into abutment with each other at the first and second cutting portions with splicing tape 30 that is fed in from above perpendicularly to first and second carrier tapes T1, T2 and is then positioned in place based on a detection signal of the tape detection sensor in the splicing position LS lying between first and second conveyance paths 60a, 60b.

2. Detailed Configuration of Joining Device

Next, a detailed configuration of joining device 58 will be described. As shown in FIGS. 8 to 12, joining device 58 includes first lifting and lowering base 91, support plate 97, second lifting and lowering base 101, swivel base 103, and the like.

Leg sections 92 of first lifting and lowering base 91 are supported on device main body 21 so as to be guided in lifting and lowering. First pressing member 91a is provided on first lifting and lowering base 91, and first positioning pins 93, 94 are provided on both sides of joining position (the abutting position) of first and second carrier tapes T1, T2 as a center, two for each side, along the feeding direction of first and second carrier tapes T1, T2 on first pressing member 91a so as to engage with positioning holes 30b1, 31b that are formed in splicing tape 30 and respective feed holes Hc of first and second carrier tapes T1, T2.

A pitch at which two pairs of first positioning pins 93, 94 are provided is determined to be twice pitch intervals Pc at which feed holes He are formed in first and second carrier tapes T1, T2. Additionally, pin holes 95 are formed individually between first positioning pins 93, 94 on first lifting and lowering base 91, and second positioning pins 105 provided on swivel base 103, which will be described later, can be inserted into these pin holes 95.

Further, movable table 96 is supported on device main body 21 so as to be guided to move in a horizontal direction that is perpendicular to the longitudinal direction of first and second carrier tapes T1, T2, and support plate 97 is attached to movable table 96 in a position lying above first positioning pins 93, 94. U-shaped groove 98, configured to store first positioning pins 93, 94 therein, is formed at the distal end of support plate 97, and support plate 97 can reciprocate between a withdrawing end, where groove 98 leaves from first positioning pins 93, 94, and an advance end where groove 98 stores first positioning pins 93, 94. The tail end of first carrier tape T1 and the leading end of second carrier tape T2 are supported on the upper surface of support plate 97.

Further, leg sections 102 of second lifting and lowering base 101 are supported on device main body 21 so as to be guided in lifting and lowering. Swivel base 103 is supported at both ends thereof on second lifting and lowering base 101 so as to be turned through 180 degrees about pivot shaft 104 parallel to the longitudinal direction of first and second carrier tapes T1, T2 as a turning center. Second pressing member 103a is provided on swivel base 103 in a position offset from the turning center, and multiple second positioning pins 105 and pin holes 106 are provided on this second pressing member 103a.

Second positioning pins 105 are aligned in positions corresponding to those defined between first positioning pins 93, 94 that are provided on first lifting and lowering base 91 and can be inserted into pin holes 95 formed in first lifting and lowering base 91. Pin holes 106 are aligned in positions corresponding to those defined between second positioning pins 105 and first positioning pins 93, 94 provided on first lifting and lowering base 91 can be inserted into pin holes 106. When swivel base 103 is turned 180 degrees, second positioning pins 105 are brought into engagement with feed holes He of first and second carrier tapes T1, T2 and positioning holes 31b, 30b1 of splicing tape 30 to thereby maintain consistently a positional relationship among those three members of first and second carrier tapes T1, T2 and splicing tape 30 configured to connect the carrier tapes together.

Pinions 107 are attached to pivot shaft 104 of swivel base 103, and racks 108 configured to mesh with pinions 107 are mounted on movable table 109 configured to move in a horizontal direction intersecting the conveyance direction of first and second carrier tapes T1, T2 at right angles. In this configuration, when movable table 109 is moved, swivel base 103 is turned by a rack-and-pinion mechanism made up of pinions 107 and racks 108. Then, when first lifting and lowering base 91 is raised, while second lifting and lowering base 101 is lowered, pressing surface 103b of second pressing member 103a of swivel base 103 is moved towards pressing surface 91b of first pressing member 91a of first lifting and lowering base 91, whereby the three members of first and second carrier tapes T1, T2 and splicing tape 30 are eventually held between pressing surface 103b of second pressing member 103a and pressing surface 91b of first pressing member 91a and connected together.

Further, cam drum 110 (corresponding to a "driving device," and a "cam" of the present disclosure) is supported on device main body 21 so as to rotate about an axis parallel to a turning center of swivel base 103 and is rotated at low speeds in a constant direction by driving motor 120 (corresponding to a "driving device," and a "cam-driving device" of the present disclosure). Two internal cam grooves and two external cam grooves 110a, 110b, 110c, 110d (corresponding to a "drive device," and a "cam" of the present disclosure) are formed endlessly in a circumferential direction on both surfaces of cam drum 110.

As shown in FIGS. 12 and 13, first follower roller 110c (corresponding to a "first cam" of the present disclosure) that is supported rotatably on leg section 92 of first lifting and lowering base 91 is brought into engagement with first cam groove 110c (corresponding to the "first cam" of the present disclosure). First cam groove 110c is provided to lift and lower first lifting and lowering base 91. That is, as shown in FIGS. 13 and 14, when cam drum 110 stays at a cam phase angle of 0°, first lifting and lowering base 91 is positioned at its bottom dead point.

Then, when cam drum 110 starts rotating to reach a cam phase angle of 145°, first lifting and lowering base 91 rises to reach its top dead point. Then, first lifting and lowering base 91 is kept positioned at the top dead point until cam drum 110 rotates to reach a cam phase angle of 265°. Further, when cam drum 110 rotates to reach a cam phase angle of 305°, first lifting and lowering base 91 falls to reach the bottom dead point, and first lifting and lowering base 91 is kept positioned at the bottom dead point until cam drum 110 rotates to reach a cam phase angle of 360° (0°).

As shown in FIGS. 12 and 15, second follower roller 110dd (corresponding to a "second cam" of the present disclosure) supported rotatably on connecting member 109b having a follower 109a that is brought into abutment with movable table 109 is brought into engagement with second cam groove 110d (corresponding to a "second cam" of the present disclosure). Movable table 109 is pulled to the left as shown in FIG. 12 at all times by tension spring 109c. Second cam groove 110d is provided to turn swivel base 103. That is, as shown in FIGS. 15 and 16, when cam drum 110 stays at a cam phase angle of 0°, swivel base 103 is in such a state that second positioning pins 105 face upwards (hereinafter, referred to as an "upward turn").

Then, when cam drum 110 starts rotating to reach a cam phase angle of 30°, swivel base 103 starts turning, and further, when cam drum 110 rotates to reach a cam phase angle of 110°, swivel base 103 is brought into such a state that second positioning pins 105 face downwards (hereinafter, referred to as a "downward turn"). Then, swivel base 103 is held in the upward turn state until cam drum 110 rotates to reach a cam phase angle of 235°.

When cam drum 110 rotates further, swivel base 103 starts rotating in an opposite direction to the previous rotating direction, and further, when cam drum 110 rotates to reach a cam phase angle of 305°, swivel base 103 is brought into the upward turn state, and swivel base 103 is kept staying in the upward turn state until cam drum 110 rotates to reach a cam phase angle of 360° (0°).

As shown in FIGS. 11 and 17, third follower roller 110aa (corresponding to a "third cam" of the present disclosure) supported rotatably on leg section 102 of second lifting and lowering base 101 is brought into engagement with third cam groove 110a (corresponding to the "third cam" of the present disclosure). Third cam groove 110a is provided to lift and lower second lifting and lowering base 101. That is, as shown in FIGS. 17 and 18, when cam drum 110 stays at a cam phase angle of 0°, second lifting and lowering base 101 is positioned at its bottom dead point.

Then, when cam drum 110 starts rotating to reach a cam phase angle of 95°, second lifting and lowering base 101 rises to reach its top dead point. Then, second lifting and lowering base 101 is kept positioned at the top dead point until cam drum 110 rotates to reach a cam phase angle of 110°. Further, when cam drum 110 rotates to reach a cam phase angle of 145°, second lifting and lowering base 101 falls to reach the bottom dead point, and second lifting and lowering base 101 is kept positioned at the bottom dead point until cam drum 110 rotates to reach a cam phase angle of 215°.

Then, when cam drum 110 rotates to reach a cam phase angle of 235°, second lifting and lowering base 101 rises to reach a height h, which is lower than the top dead point, and second lifting and lowering base 101 is kept positioned at the height h until cam drum 110 rotates to reach a cam phase angle of 280°. Further, when cam drum 110 rotates to reach a cam phase angle of 305°, second lifting and lowering base 101 is lowered to reach the bottom dead point, and second lifting and lowering base 101 is kept positioned at the bottom dead point until cam drum 110 rotates to reach a cam phase angle of 360° (0°).

Here, as described above, movable table 109 is pulled to the left as shown in FIG. 12 by tension spring 109*c* at all times to be kept in abutment with follower 109*a* of connecting member 109*b*. Thus, even when connecting member 109*b* moves movable table 109 horizontally following second cam groove 110*d*, movable table 109 and second lifting and lowering base 101 can be raised and lowered following third cam groove 110*a*.

As shown in FIGS. 11 and 19, fourth follower roller 110*bb* (corresponding to a "fourth cam" in the present disclosure) supported rotatably on arm 96*a* extending from movable table 96 connected to support plate 97 is brought into engagement with fourth cam groove 110*b* (corresponding to the "fourth cam" in the present disclosure). Fourth cam groove 110*b* is provided to cause support plate 97 to reciprocate in the horizontal direction. That is, as shown in FIGS. 19 and 20, when cam drum 110 stays at a cam phase angle of 0°, supporting plate 97 is positioned at an advance end where groove 98 accommodates first positioning pins 93, 94.

When cam drum 110 starts rotating to reach a cam phase angle of 30°, support plate 97 starts withdrawing, and further, when cam drum 110 rotates to reach a cam phase angle of 80°, supporting plate 97 reaches a withdrawing end where first positioning pins 93, 94 disengage from groove 98. Then, support plate 97 is kept positioned at the withdrawing end until cam drum 110 rotates to reach a cam phase angle of 310°. Further, when cam drum 110 rotates, support plate 97 starts advancing, and support plate 97 reaches the advance end when the cam phase angle reaches 360° (0°).

Thus, as described above, when cam drum 110 is rotated from the cam phase angle of 0°, first and second lifting and lowering bases 91, 101 are raised and lowered, support plate 97 reciprocates, and swivel base 103 turns (movable table 96 is moved horizontally) via first, second, third and fourth follower rollers 110*cc*, 110*cc*, 110*aa*, 110*bb* that engage with first, second, third and fourth cam grooves 110*c*, 110*d*, 110*a*, 110*b*, respectively. Then, when cam drum 110 makes one full rotation (i.e., rotate from the cam phase angle of 0° to 360° (0°)), first and second lifting and lowering bases 91,101, support plate 97, and swivel base 103 (i.e., movable table 96) are returned to their original positions (i.e., the cam phase angle of 0°). That is, first and second lifting and lowering bases 91,101, support plate 97, and swivel base 103 (movable table 96) perform a series of actions once when cam drum 110 makes one full rotation. When referred to in the following description, cam denotes cam drum 110; first, second, third and fourth cam grooves 110*c*, 110*d*, 110*a*, 110*b*; and first, second, third and fourth follower rollers 110*cc*, 110*cc*, 110*aa*, 110*bb*.

Here, as described in relation to the technical problem, depending on the affixation force of the splicing tape, the affixation of the splicing tape to the carrier tape becomes insufficient, leading to a risk of the splicing tape separating from the carrier tape. Then, in splicing device 20 of this embodiment, in a pressing state where first lifting and lowering base 91 and second lifting and lowering base 101 press front surface splicing tape 30*a* and rear surface splicing tape 30*b* against first carrier tape T1 and second carrier tape T2, driving motor 120 is stopped temporarily so as to stop the series of actions of the cam temporarily, and the series of actions are resumed after a predetermined time set in control device 59 has elapsed. Since the pressing state can continue for an arbitrary period of time by stopping driving motor 120 temporarily, splicing tape 30 can be affixed to the carrier tape T sufficiently. The predetermined time during which driving motor 120 is stopped temporarily can be controlled according to the type of splicing tape 30 (the type of affixing material), the type of carrier tape T, outside temperatures when splicing is performed, and the like and is set in control device 59.

That is, as shown in FIGS. 14, 16, and 18, the pressing state continues within a predetermined angle range of one rotation of cam drum 110, that is, within the range of phase angle of 145° to 215° in this embodiment. Then, control device 59 stops driving motor 120 temporarily while the cam is operating in the angle range of 145° to 215° in the series of actions. driving motor 120 should be stopped temporarily at a timing at which the cam is positioned at a central portion of the predetermined angle range, that is, at a cam phase angle of 180° (hereinafter, referred to as a "drive stop point"). This is because even though there is caused a variation in timing at which driving motor 120 is stopped temporarily, the pressing state is maintained. The time during which driving motor 120 is stopped temporarily is set according to the affixation force of splicing tape 30 to carrier tape T. The temporary stopping time of driving motor 120 is measured by a timer incorporated in control device 59.

In this embodiment, since a DC motor is used for driving motor 120, as shown in FIGS. 21A and 21B, origin sensor 111 and splicing sensor 112 are provided on device main body 21. Origin sensor 111 constitutes a sensor configured to detect original positions (the cam phase angle of 0°) of first and second lifting and lowering bases 91, 101, support plate 97 and swivel base 103 (movable table 96). Origin sensor 111 is a photoelectric sensor having light emitting element 111*a* and light receiving element 111*b*. Light emitting element 111*a* and light receiving element 111*b* are disposed on both sides of cam drum 110 so that sensor light can pass through through-hole 111*c* located where the cam phase angle of cam drum 110 is 0°.

Splicing sensor 112 constitutes a sensor configured to detect the drive stop point (the cam phase angle of 180°) of cam drum 110, that is, the timing at which driving motor 120 is stopped temporarily. Splicing sensor 112 constitutes a photoelectric sensor having light emitting element 112*a* and light receiving element 112*b*. Light emitting element 112*a* and light receiving element 112*b* are disposed on both sides of cam drum 110 so that sensor light can pass through through-hole 112c located where the cam phase angle of cam drum 110 is 180°. In order to prevent the sensor light of origin sensor 111 and the sensor light of splicing sensor 112 from interfering with each other, through-hole 112c is located in a position of cam drum 110 shifted radially relative to the position of through-hole 111c.

3. Operation of Splicing Device

Next, the operation of splicing device 20 of the embodiment described above will be described. Control device 59 controls first and second tape feed devices 50, 51 to convey first and second carrier tapes T1, T2 that are inserted from both sides of device main body 21 along first and second conveyance paths 60a, 60b and convey the predetermined first and second cutting portions of first and second carrier tapes T1, T2 to first and second cutting positions Lc1, Lc2 to position the first and second cutting portions in the first and second cutting positions (Step S1 in FIG. 22).

Control device 59 controls first and second cutting devices 54, 55 to cut carrier tapes T1, T2 at the respective cutting portions, and controls first and second take-in devices 56, 57 to take the first and the second unnecessary portions into the corresponding take-in devices (Step S2 in FIG. 22).

Then, the tail end, which is the cutting portion, of first carrier tape T1 is conveyed to splicing position LS to be positioned therein by first tape feed device 50 (Step S3 in FIG. 22, a positioning step). At the same time, the leading end, which is the cutting portion, of second carrier tape T2 is conveyed to splicing position LS to be positioned therein by second tape feed device 51 (Step S3 in FIG. 22, the positioning step). As this occurs, the tail end of first carrier tape T1 and the leading end of second carrier tape T2 are supported on the upper surface of support plate 97. By doing so, feed holes Hc1, Hc2 of first and second carrier tapes T1, T2 are positioned in a position where feed holes Hc1, Hc2 can be brought into engagement with first positioning pins 93, 94 of joining device 58 provided in splicing position LS.

Control device 59 drives stepping motor 47 of splicing tape supply member conveyance device 36 to pull out splicing tape supply member TT that is wound around supply reel 33 from supply reel 33. Then, rear surface splicing tape 30b is fed once to a position where rear surface splicing tape 30b is detected by the tape detection sensor, and then, rear surface splicing tape is fed further a certain distance from that position, whereby splicing tape 30, which is made up of the pair of front surface and rear surface splicing tapes, is conveyed to splicing position LS to be positioned therein (Step S4 in FIG. 22).

As a result, as shown in FIGS. 23 and 24, positioning holes 31b formed in base tape 31 for front surface splicing tape 30a are positioned in a position where positioning holes 31b can be brought into engagement with second positioning pins 105 of joining device 58 provided in splicing position LS. In addition, positioning holes 30b1 formed for rear surface splicing tape 30b are positioned in a position where positioning holes 30b1 can be brought into engagement with first positioning pins 93, 94 of joining device 58 provided in splicing position LS.

After having positioned first and second carrier tapes T1, T2 and splicing tape 30 in splicing position SL, control device 59 magnetically excites stepping motor 47 of splicing tape supply member conveyance device 36. That is, control device 59 positions splicing tape 30 in splicing position LS and holds the tape in a stationary holding state. As this occurs, since supply reel holding section 34 holds supply reel 33 by adding thereto a friction force acting in an opposite direction to the rotational direction of supply reel 33, splicing tape 30 can be positioned in splicing position LS highly accurately by supply reel holding section 34 coupled with splicing tape supply member conveyance device 36.

Control device 59 drives driving motor 120 to rotate cam drum 110 from the position where the cam phase angle is 0° (Step S5 in FIG. 22). As a result of the rotation of cam drum 110, firstly, first lifting and lowering base 91 is raised via first follower roller 110cc engaging with first cam groove 110c, and second lifting and lowering base 101 is raised via third follower roller 110aa engaging with third cam groove 110a. As a result, as shown in FIG. 25, first positioning pins 93, 94 of first lifting and lowering base 91 are brought into engagement with positioning holes 30b1 of rear surface splicing tape 30b and feed holes Hc of first and second carrier tapes T1, T2. In addition, second positioning pins 105 of second lifting and lowering base 101 are brought into engagement with positioning holes 31b for front surface splicing tape 30a.

As this occurs, since supporting plate 97 is interposed between rear surface splicing tape 30b and first and second carrier tapes T1, T2, as shown in FIG. 25, there is no case in which first and second carrier tapes T1, T2 are bonded to rear surface splicing tape 30b. As a result, the positional relationship among the three members of first and second carrier tapes T1, T2 and rear surface splicing tape 30b that is to be bonded to a rear surface thereof is maintained constant.

Then, when the cam phase angle of cam drum 110 becomes 30°, movable table 96 is moved horizontally via fourth follower roller 110bb engaging with fourth cam groove 110b, and movable table 109 is moved horizontally via second follower roller 110dd engaging with second cam groove 110d. Then, as a result of movable table 109 moving horizontally, swivel base 103 is turned counterclockwise as seen in FIG. 25 via the rack-and-pinion mechanism (107, 108).

When movable table 96 is moved horizontally, supporting plate 97 interposed between rear surface splicing tape 30b and first and second carrier tapes T1, T2 is withdrawn in a direction indicated by arrow Q in FIG. 26 relative to first lifting and lowering base 91, whereby rear surface splicing tape 30b and first and second carrier tapes T1, T2 can be bonded together. Then, when the cam phase angle of cam drum 110 becomes 80°, support plate 97 arrives at the withdrawing end and stays stopped at the withdrawing end until the cam phase angle of cam drum 110 becomes 310°.

In addition, when swivel base 103 is turned in a direction indicated by arrow R in FIG. 26, base tape 31 in engagement with second positioning pins 105 is folded, and front surface splicing tape 30a is turned reversely in a position above first and second carrier tapes T1, T2 with bonding surfaces thereof facing downwards. That is, base tape 31 is folded so as to hold first and second carrier tapes T1, T2, whereby rear surface splicing tape 30b is positioned on a rear surface of first and second carrier tapes T1, T2 and front surface splicing tape 30a is positioned on a front surface of first and second carrier tapes T1, T2. As this occurs, stepping motor 47 of splicing tape supply member conveyance device 36 is reversed, whereby base tape 31 is slackened, allowing base tape 31 to be folded.

Then, when the cam phase angle of the cam drum 110 becomes 110°, second lifting and lowering base 101 reaches the top dead point, and swivel base 103 reaches the downward turn state. The downward turn state of swivel base 103 is maintained until the cam phase angle of cam drum 110 becomes 235°. First lifting and lowering base 91 continues to rise while the cam phase angle of cam drum 110 reaches 110° from 30°. Although the ends of first and second carrier tapes T1, T2 flex possibly as a result of withdrawing supporting plate 97 supporting the ends of first and second carrier tapes T1, T2, since first lifting and lowering base 91 rises, first pressing member 91a supports the ends of first and second carrier tapes T1, T2, the possible flexing described above can be prevented.

Then, when the cam phase angle of cam drum 110 exceeds 110°, second lifting and lowering base 101 starts descending. As this occurs, first lifting and lowering base 91 continues to rise. As a result, as shown in FIG. 27, second positioning pins 105 of second lifting and lowering base 101 are brought into engagement with positioning holes 31b of base tape 31, feed holes He of first and second carrier tapes T1, T2 and positioning holes 30b1 of rear surface splicing tape 30b from the rear side of base tape 31.

When the cam phase angle of cam drum 110 becomes 145°, second lifting and lowering base 101 reaches the bottom dead point, while first lifting and lowering base 91 reaches the top dead point. As this occurs, as shown in FIG. 28, while holding first and second carrier tapes T1, T2, base tape 31, which is now folded, is pressed between swivel base 103 and first lifting and lowering base 91 (a pressing step). By being so pressed, rear surface splicing tape 30b affixed to base tape 31 are bonded so as to extend over the rear surface of first and second carrier tapes T1, T2, while front surface splicing tape 30a is bonded so as to extend over cover tapes affixed to the front surface of first and second carrier tapes T1, T2, whereby the tail end of first carrier tape T1 and the leading end of second carrier tape T2 are connected together.

The connection of first and second carrier tapes T1, T2 by splicing tape 30 is performed in such a state that first and second carrier tapes T1, T2 and splicing tape 30 are restrained from deviating relative to each other by first positioning pins 93 94 and second positioning pins 105, whereby first and second carrier tapes T1, T2 can be joined together accurately without generating any pitch deviation.

Although the pressing state by swivel base 103 and first lifting and lowering base 91 continues until the cam phase angle of cam drum 110 reaches 215°, control device 59 determines some time during the pressing state whether the cam phase angle of cam drum 110 reaches 180°, that is, whether a detection signal from splicing sensor 112 is received (Step S6 in FIG. 22). When the detection signal is received from splicing sensor 112, control device 59 stops driving motor 120 driving to thereby stop the series of actions of the cam temporarily (Step S7 in FIG. 22, a stop step). Then, control device 59 determines based on a time measurement by the timer incorporated in control device 59 whether the drive stop time of driving motor 120 has exceeded the predetermined time period (Step S8 in FIG. 22), and when control device 59 determines that the drive stop time of the driving motor 120 has exceeded he predetermined time period, control device 59 resumes the driving of driving motor 120 (Step S9 in FIG. 22).

When the cam phase angle of drum 110 reaches 145°, second lifting and lowering base 101 starts rising, and second rising and descending device 101 continues to rise to reach the height h (refer to FIG. 18) just before the top dead point to stop there until the cam phase angle of cam drum 110 reaches 235°. By doing so, the pressing by base tape 31 that is folded is released, and second positioning pins 105 are caused to leave positioning holes 31b for front surface splicing tape 30a and respective feed holes He of first and second carrier tapes T1, T2.

When the cam phase angle of cam drum 110 reaches 235°, swivel base 103 starts turning counterclockwise as seen in FIG. 28. As this occurs, stepping motor 47 of splicing tape supply member conveyance device 36 is rotated forward, whereby the slack in base tape 31 is removed. When the cam phase angle of cam drum 110 reaches 265°, first lifting and lowering base 91 starts descending, and when the cam phase angle of cam drum 110 reaches 280°, second lifting and lowering base 101 starts descending. As a result, first positioning pins 93, 94 withdraw from positioning holes 30b1 of rear surface splicing tape 30b and respective feed holes He of first and second carrier tapes T1, T2.

When the cam phase angle of cam drum 110 reaches 305°, first lifting and lowering base 91 and second lifting and lowering base 101 reach the bottom dead point, where swivel base 103 is brought into the upward turn state and is kept positioned in that state until the cam phase angle of cam drum 110 reaches 360° (0°). In addition, when the cam phase angle of cam drum 110 reaches 310°, support plate 97 is caused to start advancing relative to first lifting and lowering base 91, and when the cam phase angle of cam drum 110 reaches 360° (0°), support plate 97 reaches the advance end. Then, first and second lifting and lowering bases 91, 101, support plate 97 and swivel base 103 are returned to their original positions.

When receiving a detection signal from origin sensor 111 (Step S10 in FIG. 22), control device 59 stops driving motor 120 driving (Step S11 in FIG. 22), drives motor 352b of top film conveyance device 35, imparts tension to top film 32, and stops motor 352b driving after top film 32 is separated by a necessary amount. This completes joining of the tail end of first carrier tape T1 and the leading end of second carrier tape T2 together. Then, control device 59 determines whether another splicing is performed (Step S12 in FIG. 22), and when control device 59 determines that another splicing is performed, control device 59 returns to Step S1, repeating the series of steps described heretofore, whereas when control device 59 determines that another splicing is not performed, control device 59 ends the whole splicing process.

4. Other

In the embodiment that has been described heretofore, the series of actions taken when connecting first and second carrier tapes T1, T2 with splicing tape 30 includes a series of actions of rising and descending of first and second lifting and lowering bases 91, 101 resulting from the rotation of cam drum 110, horizontal moving of supporting plate 97, and rightward and leftward turning of swivel base 103 (horizontal moving of movable table 96). That is, the series of actions is a series of actions in which first pressing member 91a and second pressing member 103a start to move in the pressing direction from the initial positions or the non-pressing state where pressing surface 91b of first pressing member 91a and pressing surface 103b of second pressing member 103a are not pressed against each other, shift to the pressing state, start to move in the releasing direction and return to the initial positions. Thus, with any drive device that can perform the series of actions, the present disclosure is not limited to the cam and driving motor 120 of this embodiment, and hence, four direct acting actuators (for example, air cylinder, hydraulic cylinder, linear motor or the like) may be used which are coupled directly with such members as first and second lifting and lowering bases 91, 101, support plate 97 and movable table 96, or one motor or one direct acting actuator may be used which actuates a linking mechanism configured to couple together those members.

In addition, although the members described above are configured to be driven to operate by one cam drum 110 having four cam grooves 110c, 110a 110d, 110b and single driving motor 120, a configuration may be adopted in which four cam drums each having a cam groove formed thereon are provided individually for the members, or multiple cam drums having an arbitrary combination of cam grooves formed thereon are provided, and one or multiple driving motors configured to drive the corresponding cam drums are provided to operate the cam drums. This configuration is also similarly applied to the case where the linking mechanism is combined with the motor or the direct acting actuator.

Although the DC motor is used as driving motor 120, a stepping motor, a servomotor, an AC motor, an ultrasonic motor, an electrostatic motor, a hydraulic motor, a pneumatic motor or the like can be used. When a stepping motor is used, the motor can be controlled based on the number of pulses, and origin sensor 111 and splicing sensor 112 are provided. When a servomotor is used, the motor can be controlled by an encoder, and only splicing sensor 112 is provided.

Although the transmission photoelectric sensor is used as origin sensor 111 and splicing sensor 112, a reflection photoelectric sensor may be used. In addition, an electromagnetic sensor, an acoustic wave sensor, a mechanical contact sensor, or the like can also be used. Although the drive stop point is described as being detected by splicing sensor 112, the drive stop point may be obtained based on a time that has elapsed after detection of an origin by origin sensor 111.

5. Advantageous Effects of Embodiment

In splicing device 20 described in the embodiment that has been described heretofore, splicing device 20 is configured to splice first carrier tape T1 and second carrier tape T2, which both have component storing cavities Ct, with first splicing tape 30a and second splicing tape 30b and includes positioning devices 50, 51 configured to feed first carrier tape T1 and second carrier tape T2 such that first carrier tape T1 and second carrier tape T2 move towards each other to position the end of first carrier tape T1 and the end of second carrier tape T2 in splicing position LS, and first pressing member 91a configured to press first splicing tape 30a against the first surfaces of first carrier tape T1 and second carrier tape T2 that are positioned in splicing position LS so as to extend over first carrier tape T1 and second carrier tape T2.

Further, splicing device 20 includes second pressing member 101a configured to press second splicing tape 30b against the second surfaces of first carrier tape T1 and second carrier tape T2 that are positioned in splicing position LS so as to extend over first carrier tape T1 and second carrier tape T2, drive devices 120, 110, 110a, 110b, 110c, 110d and the like configured to cause first pressing surface 91b of first pressing member 91a and pressing member 101b of second pressing member 101a to reciprocate towards and away from each other through the series of actions, and control device 59 configured to stop the series of actions of drive devices 120, 110, 110a, 110b, 110c, 110d and the like temporarily in the pressing state where first pressing member 91a and second pressing member 101a press first splicing tape 30a and second splicing tape 30b against first carrier tape T1 and second carrier tape T2 through the series of actions of drive devices 120, 110, 110a, 110b, 110c, 110d and the like.

According to this configuration, since splicing device 20 stops temporarily the series of actions of drive devices 120, 110, 110a, 110b, 110c, 110d and the like configured to drive first and second pressing members 91a, 101a in the pressing state where first and second pressing members 91a, 101a press first and second splicing tapes 30a, 30b against first and second carrier tapes T1, T2, the pressing time of splicing tapes 30a, 30b against first and second carrier tapes T1, T2 can be extended. Thus, splicing tapes 30a, 30b can be reliably affixed to first and second carrier tapes T1, T2.

In addition, the drive device includes cams 110, 110a, 110b, 110c, 110d and the like configured to cause pressing surface 91b of first pressing member 91a and pressing surface 101b of second pressing member 101a to reciprocate towards and away from each other and the cam drive device 120 configured to drive cams 110, 110a, 110b, 110c, 110d and the like so as to cause cams 110, 110a, 110b, 110c, 110d to execute the series of actions, and control device 59 stops temporarily cam drive device 120 in the pressing state to thereby stop temporarily the series of actions of cams 110, 110a, 110b, 110c, 110d and the like. The drive device can be configured simply and easily, and at low cost.

Cams 110, 110a, 110b, 110c, 110d and the like perform the series of actions once while they make one full rotation, cams 110, 110a, 110b, 110c, 110d and the like continue the pressing state within the predetermined angle range in one rotation, and control device 59 stops temporarily the series of actions of cams 110, 110a, 110b, 110c, 110d and the like while cams 110, 110a, 110b, 110c, 110d and the like are performing their actions within the predetermined angle range in the series of actions. Since drive device 59 only has to stop temporarily cams 110, 110a, 110b, 110c, 110d and the like while cams 110, 110a, 110b, 110c, 110d and the like are performing their actions within the predetermined angle range in the series of actions, control device 59 can execute easily the temporary stop control.

Drive device 59 stops temporarily the series of actions of cams 110, 110a, 110b, 110c, 110d and the like when cams 110, 110a, 110b, 110c, 110d and the like are positioned at the central portion of the predetermined angle range. Even though there is a variation in timing at which cams 110, 110a, 110b, 110c, 110d and the like are stopped temporarily, the pressing state is maintained in which first and second pressing members 91a, 101a press splicing tapes 30a, 30b against first and second carrier tapes T1, T2, whereby splicing tapes 30a, 30b can be reliably affixed to first and second carrier tapes T1, T2.

Splicing device 20 includes the conveyance device 36 configured to feed the splicing tape supply member TT including the base tape 31 and first splicing tape 30a and second splicing tape 30b that are affixed to the base tape 31 in the direction intersecting the feeding direction of first carrier tape T1 and second carrier tape T2 at right angles, and the drive device includes first cam 110c, 110cc, configured to cause first pressing member 91a to reciprocate towards and away from second pressing member 101a through the series of actions in such a state that pressing surface 91b of first pressing member 91a faces pressing surface 101b of second pressing member 101a, and second cam 110d, 110dd, configured to oscillate second pressing member 101a so as to move between the position where base tape 31 is folded to face pressing surface 91b of first pressing member 91a and the position where base tape 31 is stretched not to face pressing surface 91b of first pressing member 91a through the series of actions.

Further, the drive device includes third cam 110a, 110aa, configured to cause second pressing member 101a to reciprocate towards and away from first pressing member 91a in such a state that pressing surface 101b of second pressing member 101a faces pressing surface 91b of first pressing member 91a, and the cam drive device 120 configured to drive first cam 110c, 110cc, second cam 110d, 110dd and third cam 110a, 110aa in synchronism with one another, and drive device 59 stops temporarily the cam drive device 120 in the pressing state to thereby stop temporarily the series of actions of first cam 110c, 110cc, second cam 110d, 110dd and third cam 110a, 110aa. Since control device 59 only has to control cam drive device 120, control device 59 can stop temporarily the series of actions of cams 110, 110a, 110b, 110c, 110d and the like reliably.

The splicing method of the embodiment that has been described heretofore is the splicing method for splicing together first carrier tape T1 and second carrier tape T2, which have the component storage cavities Ct, with first splicing tape 30a and second splicing tape 30b, the splicing method including the positioning step of feeding first carrier tape T1 and second carrier tape T2 in the directions in which first carrier tape T1 and second carrier tape T2 move towards each other to position the end of first carrier tape T1 and the end of second carrier tape T2 in the splicing position LS and the pressing step of pressing first splicing tape 30a against the first surfaces of first carrier tape T1 and second carrier tape T2, which are positioned in the splicing position LS, so as to extend over first carrier tape T1 and second carrier tape T2 and pressing second splicing tape 30b against the second surfaces of first carrier tape T1 and second carrier tape T2, which are positioned in splicing position LS, so as to extend over first carrier tape T1 and second carrier tape T2 through the series of actions of drive devices 120, 110, 110a, 110b, 110c, 110d and the like.

The splicing method includes the stop step of stopping temporarily the series of actions of drive devices 120, 110, 110a, 110b, 110c, 110d and the like in the pressing state where first splicing tape 30a and second splicing tape 30b are pressed against first carrier tape T1 and second carrier tape T2 through the series of actions of drive devices 120, 110, 110a, 110b, 110c, 110d and the like. The same working effect as that obtained by splicing device 20 described above can be obtained.

REFERENCE SIGNS LIST

20 . . . splicing device, 30 (30 a, 30 b) . . . Splicing tape, 36 . . . Splicing tape supply member conveyance device, 50 . . . First tape feed device (positioning device), 51 . . . Second tape feed device (positioning device), 58 . . . Joining device, 91 . . . First lifting and lowering base, 91a . . . First pressing member, 91b . . . Pressing surface, 97 . . . Support plate, 101 . . . Second lifting and lowering base, 103 . . . Swivel base, 103a . . . Second pressing member, 103b . . . Pressing surface, 110 . . . Cam drum, 110c . . . First cam groove, 110d . . . Second cam groove, 110a . . . Third cam groove, 110b . . . Fourth cam groove, 110cc . . . First follower roller, 110dd . . . Second follower roller, 110aa . . . Third follower roller, 110bb . . . Fourth follower roller, 120 . . . Driving motor, T (T1, T2) . . . Carrier tape, TT . . . Splicing tape supply member, LS . . . Splicing position.

The invention claimed is:

1. A splicing device for connecting a first carrier tape and a second carrier tape together with a first splicing tape and a second splicing tape, the first carrier tape and the second carrier tape having component storing cavities, the splicing device comprising:
 a positioning device configured to feed the first carrier tape and the second carrier tape in directions, in which the first carrier tape and the second carrier tape approach each other, and position an end of the first carrier tape and an end of the second carrier tape in a splicing position;
 a first pressing member configured to press the first splicing tape extendingly against a first surface of the first carrier tape and the second carrier tape, which are both positioned in the splicing position;
 a second pressing member configured to press the second splicing tape extendingly against a second surface of the first carrier tape and the second carrier tape, which are both positioned in the splicing position;
 a driving device including
  a cam configured to move relatively and reciprocally a pressing surface of the first pressing member and a pressing surface of the second pressing member in directions in which the pressing surface of the first pressing member and the pressing surface of the second pressing member move towards and away from each other by performing a series of actions, and
  a motor to rotate and drive the cam; and
 a control device configured to stop temporarily the series of actions of the driving device by stopping the motor for a predetermined time while the cam as at a predetermined cam phase during a pressing state where the first pressing member and the second pressing member are pressing the first splicing tape and the second splicing tape respectively against the first carrier tape and the second carrier tape through the series of actions of the driving device.

2. The splicing device according to claim 1,
 wherein the cam performs the series of actions once through one full rotation,
 wherein the cam keeps the pressing state continuing within a predetermined angle range of the one full rotation, and
 wherein the control device stops temporarily the series of actions of the cam while the cam is acting within the predetermined angle range in the series of actions of the cam.

3. The splicing device according to claim 2,
 wherein the control device stops temporarily the series of actions of the cam when the cam stays at a central portion of the predetermined angle range.

4. The splicing device according to claim 1, comprising:
 a conveyance device configured to feed a splicing tape supply member comprising a base tape and the first splicing tape and the second splicing tape that are affixed to the base tape in a direction intersecting a feeding direction of the first carrier tape and the second carrier tape,
 wherein the chive device comprises:
 a first cam configured to cause the first pressing member to reciprocate towards and away from the second pressing member through the series of actions in such a state that the pressing surface of the first pressing member faces the pressing surface of the second pressing member;

a second cam configured to oscillate the second pressing member through the series of actions so as to move between a position where the base tape is folded to face the pressing surface of the first pressing member and a position where the base tape is stretched not to face the pressing surface of the first pressing member;

a third cam configured to cause the second pressing member to reciprocate towards and away from the first pressing member through the series of actions in such a state that the pressing surface of the second pressing member faces the pressing member of the first pressing member; and a cam drive device configured to drive the first cam, the second cam and the third cam in synchronism with one another, wherein the control device stops temporarily the cam drive device to thereby stop temporarily the series of actions of the first cam, the second cam and the third cam in the pressing state.

5. A splicing method for connecting a first carrier tape and a second carrier tape together with a first splicing tape and a second splicing tape, the first carrier tape and the second carrier tape having component storing cavities, the splicing method comprising:

a positioning step of feeding the first carrier tape and the second carrier tape such that the first carrier tape and the second carrier tape move towards each other to position an end of the first carrier tape and an end of the second carrier tape in a splicing position;

a pressing step of pressing the first splicing tape against a first surface of the first carrier tape and the second carrier tape, which are both positioned in the splicing position, so as to extend over the first carrier tape and the second carrier tape through a series of actions of a driving device and pressing the second splicing tape against a second surface of the first carrier tape and the second carrier tape, which are both positioned in the splicing position, so as to extend over the first carrier tape and the second carrier tape through the series of actions of the driving device, the driving device including a cam configured to move relatively and reciprocally a pressing surface of a first pressing member that presses the first surface and a pressing surface of a second pressing member that presses the second surface; and a stopping step of stopping temporarily the series of actions of the driving device by stopping the motor for a predetermined time while the cam as at a predetermined cam phase during a pressing state where the first splicing tape and the second splicing tape are being pressed against the first carrier tape and the second carrier tape through the series of actions of the driving device.

* * * * *